United States Patent [19]

Nettelbladt et al.

[11] Patent Number: 5,151,756
[45] Date of Patent: Sep. 29, 1992

[54] SURFACE EMITTING HETEROJUNCTION LIGHT EMITTING DIODE

[75] Inventors: Hans K. Nettelbladt, Bromma; Karl M. Widman, Kungsängen, both of Sweden

[73] Assignee: Asea Brown Boveri AB, Västerås, Sweden

[21] Appl. No.: 731,776

[22] Filed: Jul. 18, 1991

[30] Foreign Application Priority Data

May 8, 1991 [SE] Sweden .................. 9101395

[51] Int. Cl.⁵ .................. H01L 33/00
[52] U.S. Cl. .................. 357/17; 357/16; 357/55
[58] Field of Search .................. 357/17, 16, 55, 56

[56] References Cited

U.S. PATENT DOCUMENTS

| | | | |
|---|---|---|---|
| 4,570,172 | 2/1986 | Henry et al. | 357/17 |
| 4,706,101 | 11/1987 | Nakamura et al. | 357/17 |
| 4,819,048 | 4/1989 | Mand et al. | 357/17 |
| 4,864,369 | 9/1989 | Snyder et al. | 357/17 |
| 4,905,058 | 2/1990 | Yamada et al. | 357/17 |
| 5,077,588 | 12/1991 | Yamada et al. | 357/17 |

Primary Examiner—William Mintel
Attorney, Agent, or Firm—Pollock, Vande Sande & Priddy

[57] ABSTRACT

A surface emitting LED has a PN junction between two semiconductor layers, at least one layer being an active layer. The diode is adapted for emitting light through an exit surface. Between the active layer and the exit surface the diode has a luminescence layer with a narrower energy gap than that of the active layer.

11 Claims, 7 Drawing Sheets

SURFACE EMITTING HETEROJUNCTION LIGHT EMITTING DIODE

TECHNICAL FIELD

The present invention relates to a surface emitting light emitting diode (LED) with a PN junction between two semiconductor layers, of which at least one is active, the diode being adapted to emit light through a predetermined exit surface.

BACKGROUND ART

By a surface emitting LED is meant an LED which is designed such that at least the main part of the emitted light is emitted from the diode through an exit surface which is substantially parallel to the PN junctions of the diode. By the concept LED is meant a semiconductor device with an active layer adjoining a PN junction. When current is conducted through the diode, charge carriers are injected into the active layer, and upon recombination of the charge carriers, light is emitted. The wavelength of the emitted light is determined by the energy gap of the material in the active layer, and the wavelength is inversely proportional to this energy gap.

FIG. 1a shows an example of an LED of the above kind. The material therein may, for example, be GaAlAs. The semiconductor body comprises four layers 1-4. The layers 1 and 2 are P-doped doped and the layers 3 and 4 N-doped. In layers 1 and 3 the material has a wider energy gap than in the layer 2. The layer 2 constitutes the active layer of the diode. The energy gap of the material may be controlled by variation of the aluminium content of the material. A PN junction 6 is formed between the layers 2 and 3. The layer 1 is provided with a contact 5a and the layer 4 with an annular contact 5b for supply of current to the diode. The layer 4 has a centrally arranged well which extends down to the exit surface 7. When current traverses the PN junction, charge carriers are injected, which substantially recombine in the active layer 2, whereby light is emitted. The main part of the light is emitted through the exit surface 7, and the emitted light is in FIG. 1a symbolically shown with the aid of the arrow designated hv.

FIG. 1b illustrates the energy gap $E_g$ for the layers 1-3 as a function of z, where z is the distance along the normal direction to the exit surface 7. The layers 1 and 3 have the equally large energy gaps $E_{g1}$ and $E_{g3}$, respectively, which are greater than the energy gap $E_{gA}$ of the active layer 2.

The layer 1 may, for example, have the thickness 2 μm, the layer 2 the thickness 2 μm, and the layer 3 the thickness 10 μm.

FIG. 1c shows the intensity $P_{80}$ of the emitted light as a function of its wavelength λ. The intensity maximum occurs at the wavelength $\lambda_p$. The spectral line width of the LED, that is, the half-width of the intensity curve shown in FIG. 1c, in a typical LED of the described kind is relatively small, typically about 50 nm.

In certain applications, for example during simultaneous supply of several receivers at separate wavelengths (wavelength-divided multiplex), the low line width of prior art LEDs has proved to be a considerable drawback.

SUMMARY OF THE INVENTION

The present invention relates to an LED of the kind described in the introductory part of the specification. The invention aims to achieve, in a simple and advantageous manner, an increase of the spectral line width of such an LED.

What characterizes an LED according to the invention will be clear from the appended claims.

BRIEF DESCRIPTION OF THE DRAWINGS

In the following the present invention will be described with reference to the accompanying Figures wherein:

FIG. 2b shows the light intensity as a function of the wavelength for the diode shown in FIG. 2a;

FIG. 3b shows the intensity of the emitted light as a function of the wavelength for the diode shown in FIG. 3a;

DESCRIPTION OF THE PREFERRED EMBODIMENTS

Figure 1A:
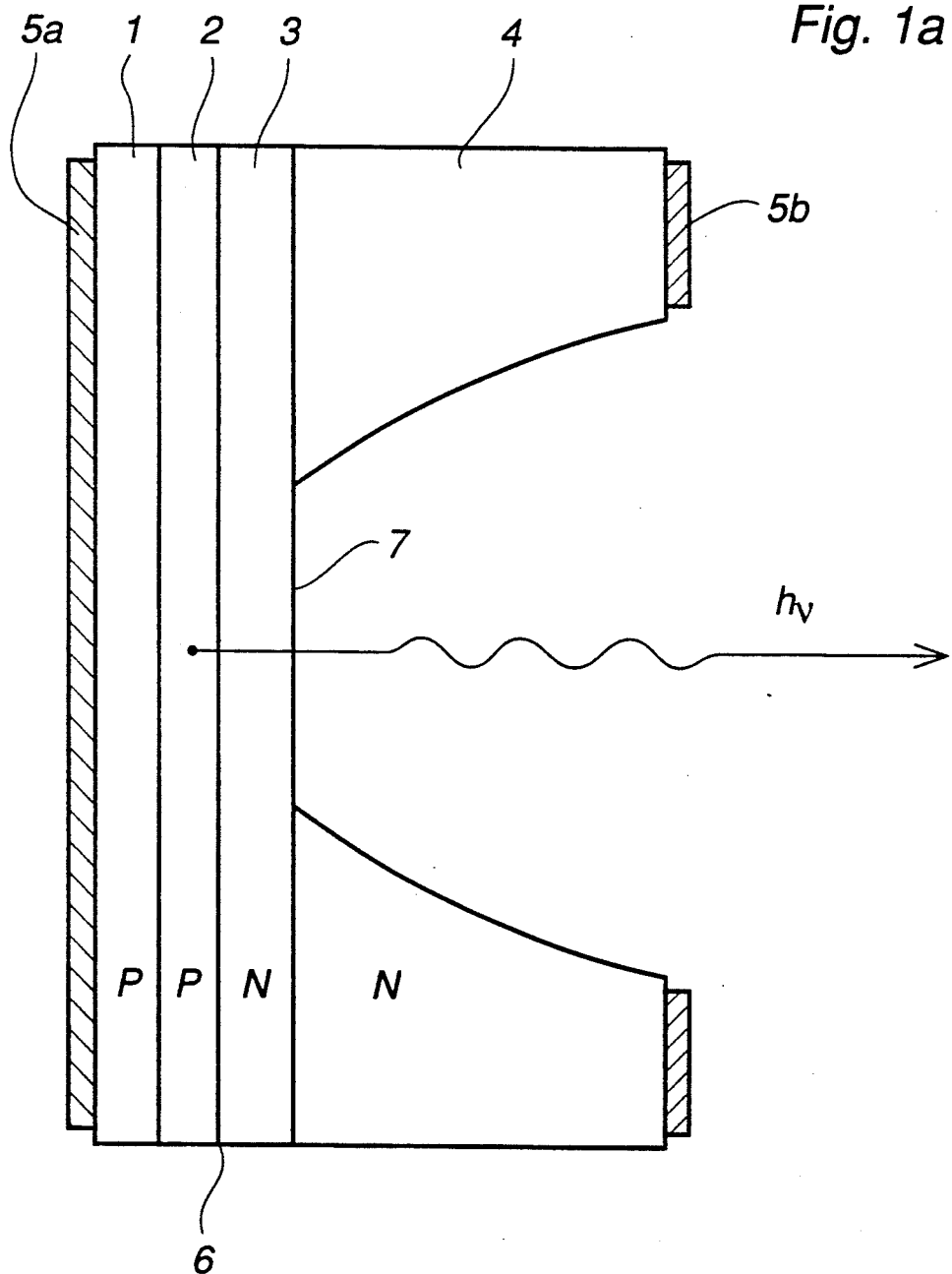
FIG. 1a shows a section through a prior art LED of the kind described above.
Figure 1B:
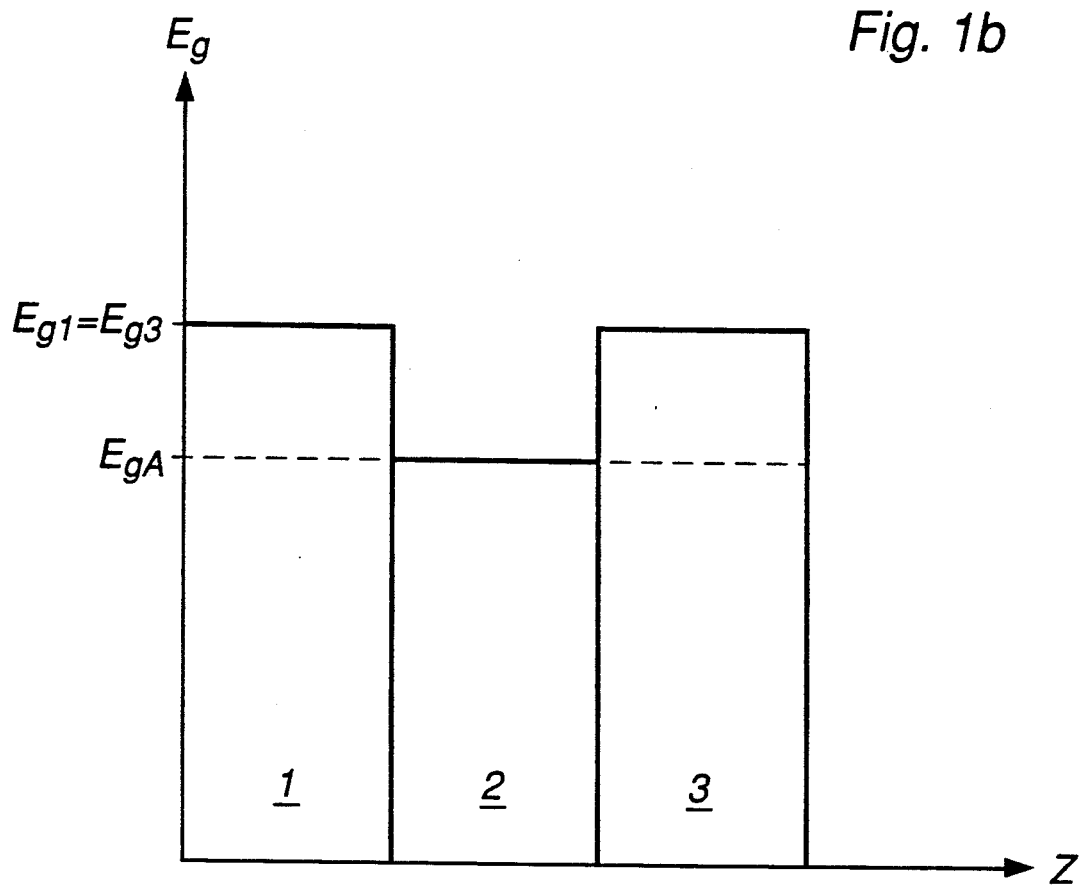
FIG. 1b shows the energy gaps for the different layers of the diode.
Figure 1C:
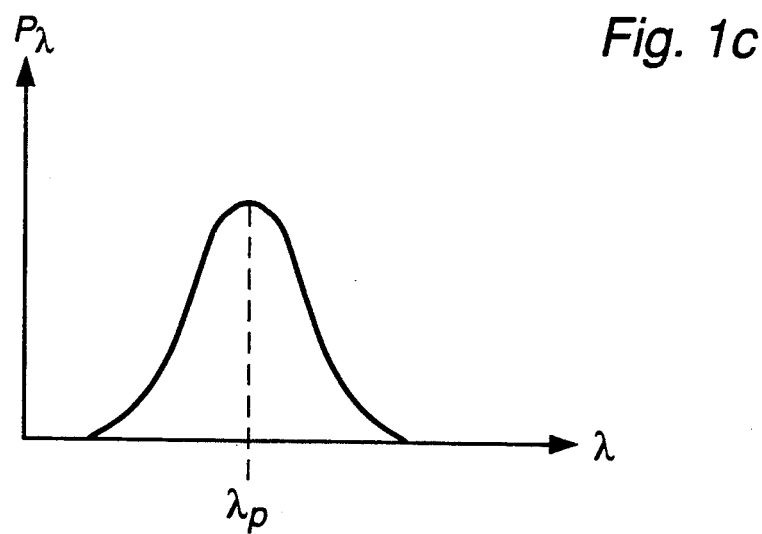
FIG. 1c shows the intensity of the light emitted from the diode as a function of the wave-length.
Figure 2A:
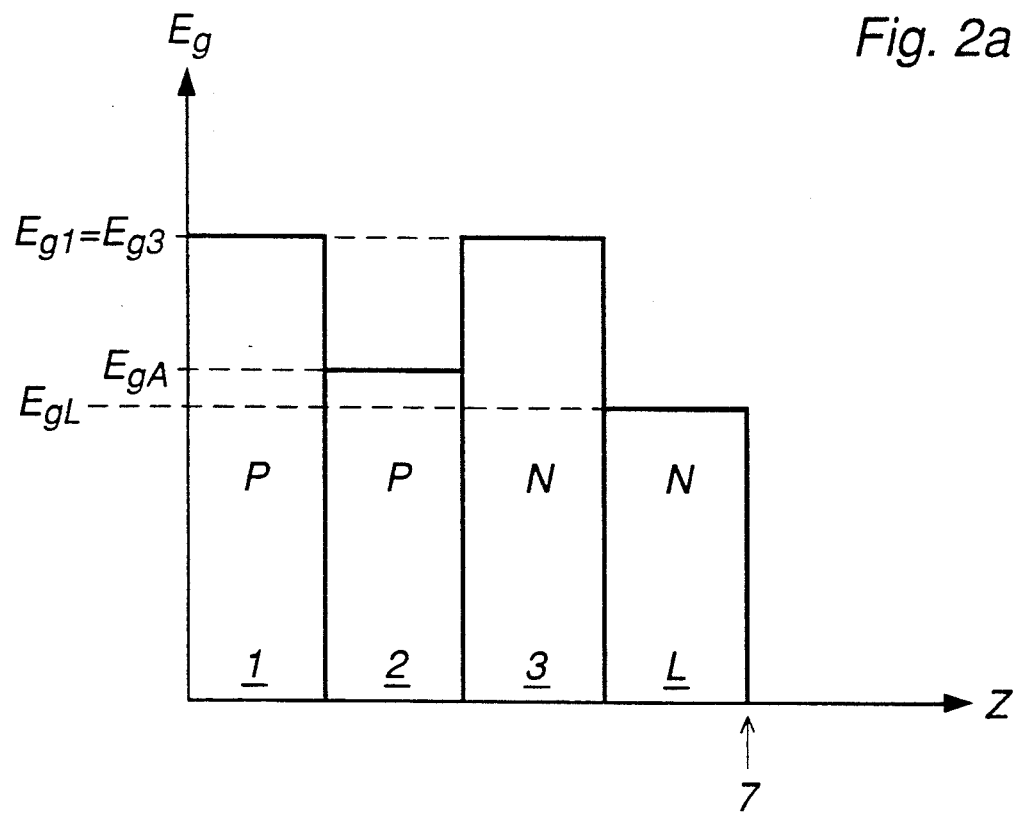
FIG. 2a shows the energy gaps of the different layers in an LED according to the present invention, in which a luminescence layer is provided between the active layer and the exit surface of the diode.

FIG. 2a shows an LED according to the present invention. The diode is composed in the same manner as the diode shown in FIG. 1, that is, it consists of a double heterostructure with two layers 1 and 3 with wider energy gaps arranged on both sides of an active layer 2 with a narrower energy gap. Between the layer 3 and the exit surface 7, an additional layer L, a so-called luminescence layer, is arranged according to the invention. The material in this layer has a narrower energy gap, $E_{gL}$, than the energy gap $E_{gA}$ in the active layer 2. In the same way as the layer 3, the layer L is N-doped. When the diode is traversed by current, light is emitted from the active layer 2. This light is partially absorbed and excites charge carriers in the layer L. These charge carriers recombine and thus emit light, which has a wavelength $\lambda_L$ which is determined by the energy gap $E_{gL}$ of the material in the layer L. The wavelength $\lambda_L$ of the light emitted from the layer L differs from the wavelength $\lambda_L$ of the light emitted from the layer 2. By a suitable choice of the energy gaps of the two layers, the intensity curves for the light from the two layers may be caused to overlap in such a way that the total intensity of the light emitted from the diode varies with the wavelength in the manner shown in FIG. 2b. The dashed line in the figure designates the intensity curve for the light from the active layer 2, which corresponds to the intensity curve for a known LED of the kind described with reference to FIG. 1. As will be clear from FIG. 2b, in an LED according to the invention a considerably larger spectral line width is obtained than in prior art LEDs.

Figure 2B:
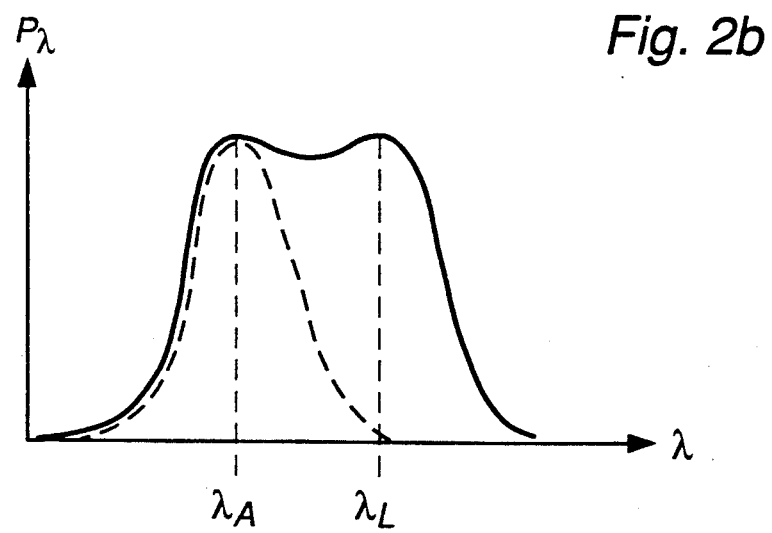

The magnitude of the intensity of the two intensity peaks of the curve in FIG. 2b may be influenced by the choice of thickness of the layer L. In an LED of the above-described kind, for example, a thickness of the layer L of 1 μm has proved to result in about half of the light emitted from the layer 2 being absorbed in L and half of the light being transmitted through the layer L, which gives the curve shown in FIG. 2b with approximately the same intensity of the two intensity peaks.

Figure 3A:
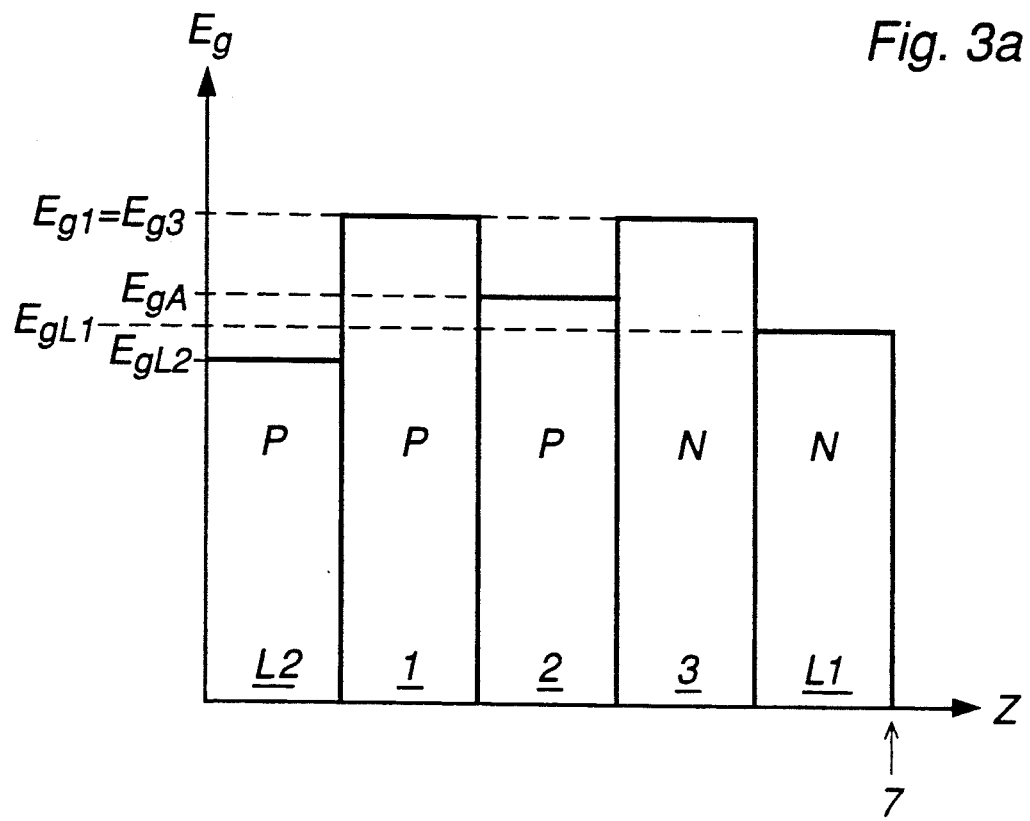
FIG. 3a shows an alternative embodiment of a diode according to the invention, in which two luminescence layers are arranged on both sides of the active layer.
Figure 3B:
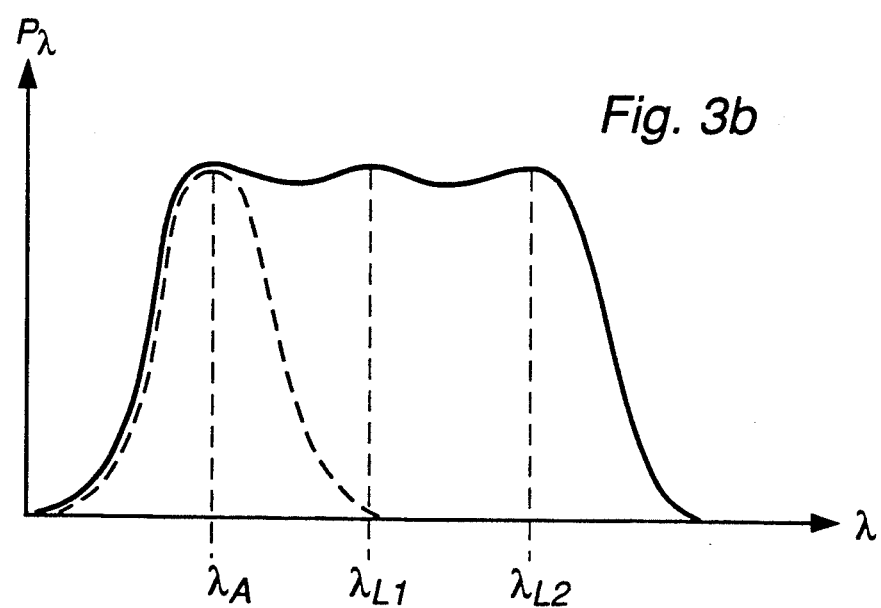

In the alternative embodiment of the invention shown in FIG. 3a, the layer L1 corresponds to the layer L in FIG. 2a. In addition, a second P-doped luminescence layer L2 has been arranged to the left of the layer 2. The layer L1 has an energy gap $E_{gL1}$ which is narrower than the energy gap $E_{gA}$ of the active layer 2. The second luminescence layer L2 has an energy gap $E_{gL2}$ which is narrower than the energy gap $E_{gL1}$ of the layer L1. In the same way as described above with reference to FIG. 2, light with an intensity maximum at the wavelength $\lambda_A$ is emitted from the layer 2. About half of this light is emitted to the right in the figure and, in the manner described with reference to FIG. 2, causes emission of light from the layer L1 with an intensity maximum at the wavelength $\lambda_{L1}$. About half of the light emitted from the layer 2 is emitted to the left in the figure and in the same way excites charge carriers in the layer L2. Upon recombination of these charge carriers, light is emitted from the layer L2 with an intensity maximum at the wavelength $\lambda_{L2}$. By a suitable choice of the energy gaps of the layers 2, L1 and L2, the intensity curves of the light emitted from these layers may be caused to overlap and provide a resultant intensity curve with the appearance shown in FIG. 3b. As will be clear from this figure, an even larger increase of the total spectral line width may be obtained in this way. In a typical LED of this kind, a line width of about 120 nm may be obtained.

In the same way as described above with reference to FIG. 2, the intensity of the light emitted from the layers L1 and L2 may be controlled by the choice of the thicknesses of these layers.

Figure 4:
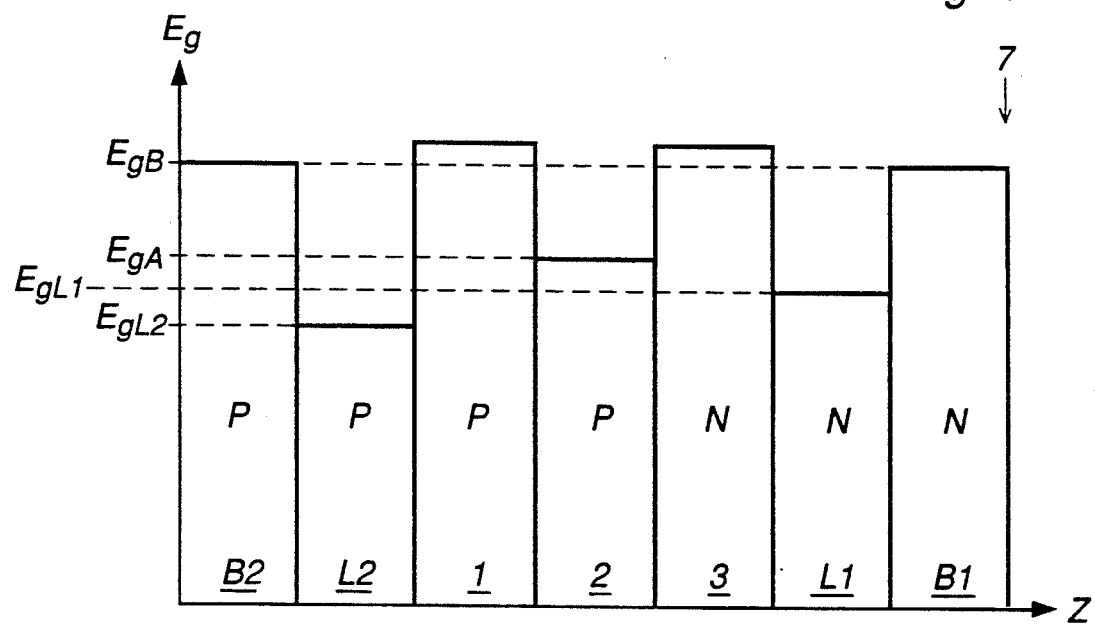
FIG. 4 shown another embodiment of a diode according to the invention, in which blocking layers have been provided adjacent to the luminescence layers.

FIG. 4 shows an additional embodiment of an LED according to the invention. In this, an N-doped blocking layer B1 has been arranged between the layer L1 and the exit surface 7, and a second blocking layer B2 has been arranged to the left of the layer L2. The layer B2 is P-doped. The layers B1 and B2 are made of material with a wider energy gap $E_{gB}$ than that of the active layer, for example with approximately the same energy gap as that of layers 1 and 3. The blocking layers B1 and B2 cause charge carriers to be retained in the luminescence layers, whereby an increased relative intensity of the light emitted from these layers is obtained.

Figure 5:
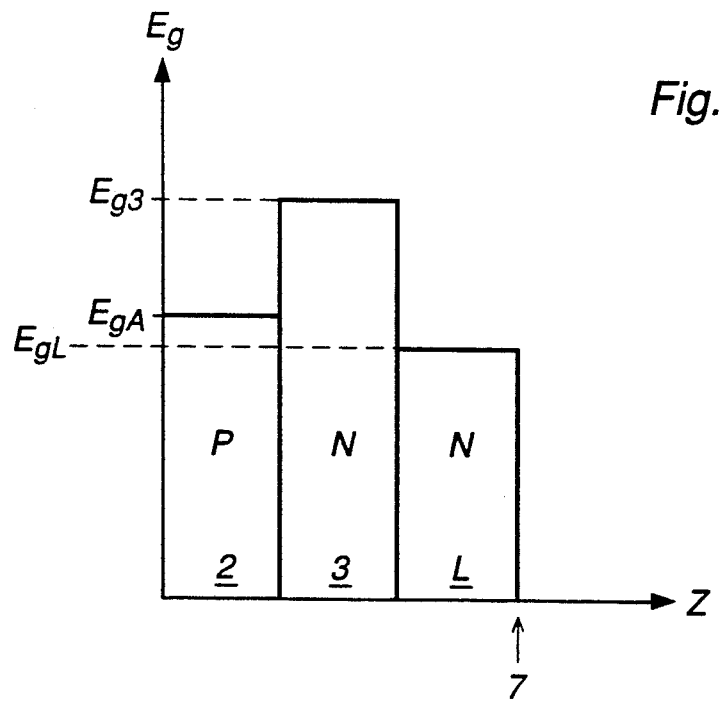
FIG. 5 shows still another embodiment of the invention, in which a luminescence layer has been arranged adjacent to an LED with a so-called simple heterostructure.

The above embodiments of the invention describe the invention applied to an LED with a double heterostructure, that is, with two heterojunctions (junctions between materials with different energy gaps). FIG. 5 shows how the invention may be applied also to an LED with a single heterostructure, that is, with one single heterojunction. The LED may then consist of a P-doped layer 2, which constitutes the active layer of the diode and has the energy gap $E_{gA}$. Further, the diode has an N-doped layer 3 with a wider energy gap than that of the layer 2, and between the layers 2 and 3 the PN junction of the diode is produced. A luminescence layer according to the invention is arranged between the layer 3 and the exit surface 7 of the diode. The function of the luminescence layer will be the same as that described above, for example with reference to FIG. 2. Alternatively, as described with reference to FIGS. 3, 4, 7, 8, one or several additional luminescence layers may be arranged and, further, blocking layers according to FIGS. 4, 7, 8 may be arranged on one or both sides of the structure shown in FIG. 5.

Figure 6:
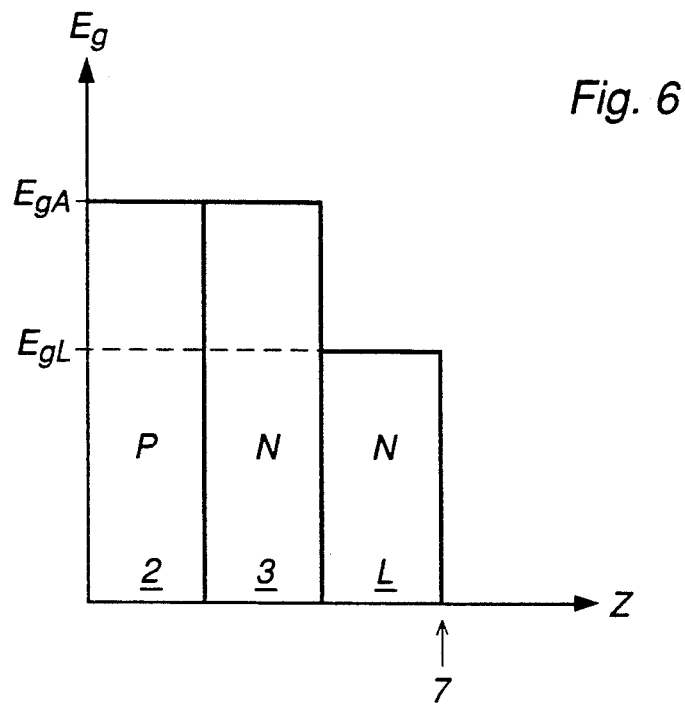
FIG. 6 shows an additional embodiment of the present invention, in which a luminescence layer has been arranged adjacent to an LED with a so-called homostructure.

As an alternative, FIG. 6 shows how the invention may be applied to an LED with a so-called homostructure, that is, a diode in which the layers on both sides of the PN junction of the diode have approximately the same energy gap. The layer 2 in the figure is P-doped and the layer 3 N-doped, and both layers have the energy gap $E_{gA}$. Between the layer 3 and the exit surface 7 of the diode, a luminescence layer L is arranged. In the same way as mentioned above with reference to FIG. 5, the diode may be provided with additional luminescence layers, as well as with one or more blocking layers.

Figure 7:
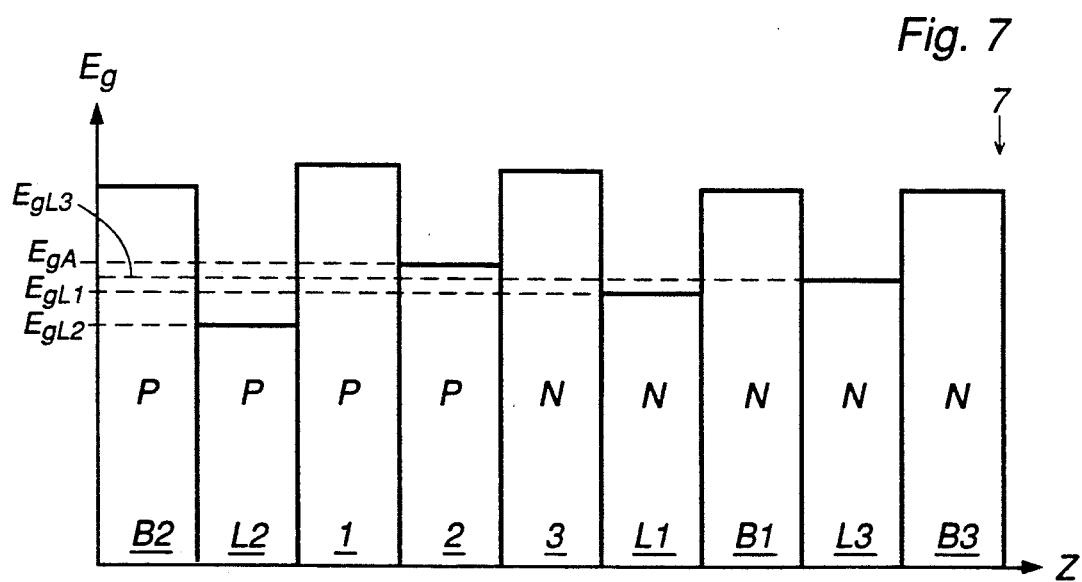
FIG. 7 shows and LED according to the invention with three luminescence layers.

FIG. 7 shows yet another embodiment of an LED according to the invention. Compared with the diode shown in FIG. 4, a third luminescence layer L3 and a third blocking layer B3 have been added between the layer B1 and the exit surface 7. The material in the layer L3 has an energy gap $E_{gL3}$ which is narrower than $E_{gA}$ but wider than $E_{gL1}$ and $E_{gL2}$. Light will be generated also in the luminescence layer L3 and with a wavelength which is different from the wavelength of the light from the active layer 2 and the two blocking layers L1 and L2. In this way, an additional increase may be obtained of the spectral line width of the diode, and it has been found that a line width of about 150 nm may be obtained.

Figure 8:
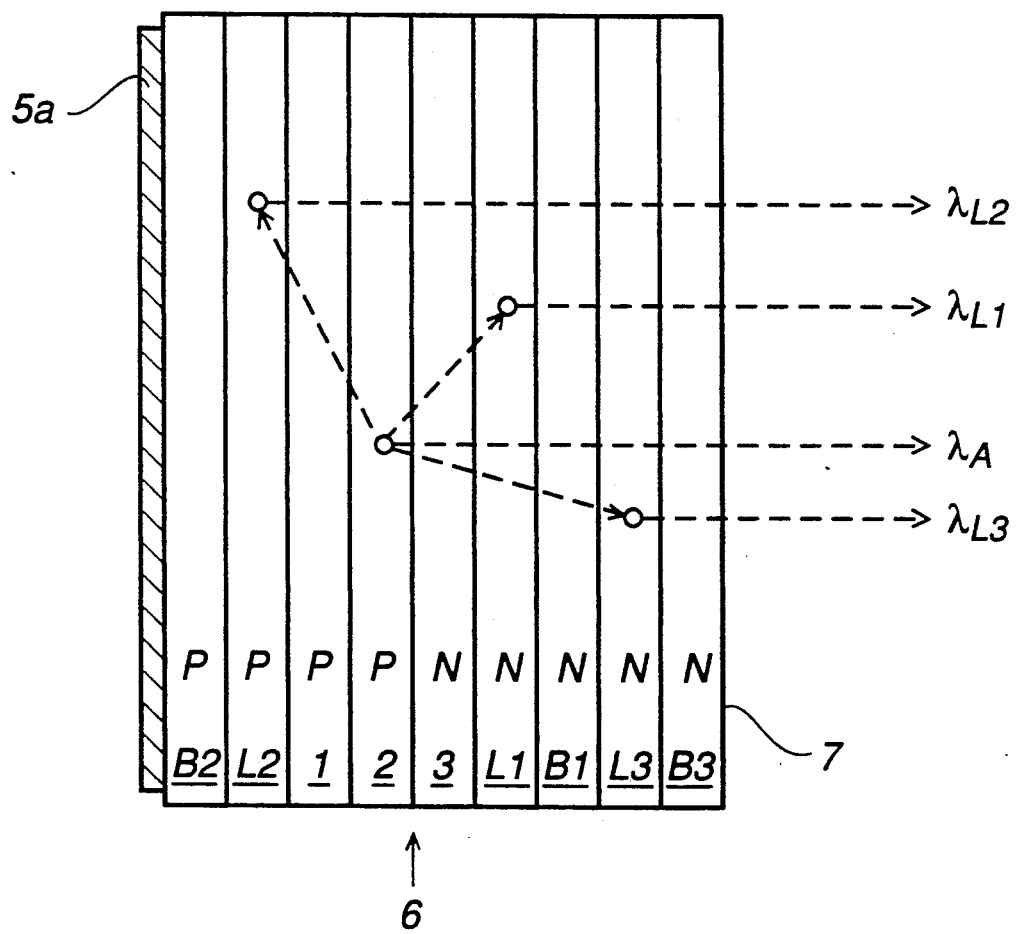
FIG. 8 shows a section through an LED according to FIG. 7.

FIG. 8 shows a section through an LED according to FIG. 7. The figure schematically shows how the light emitted from the diode is composed of four components. A first component consist of the light emitted directly from the active layer 2 with an intensity maximum at the wavelength $\lambda_A$. Part of the light from the layer 2 is absorbed in the layer L1 and causes emission from this layer of light with an intensity maximum at the wavelength $\lambda_{L1}$. An additional part of the light from the layer 2 is absorbed in the layer L2 and causes emission from this layer of light with an intensity maximum at the wavelength $\lambda_{L2}$. Yet another part of the light from the active layer 2 is absorbed in the layer L3 and causes emission from this layer of light with an intensity maximum at the wavelength $\lambda_{L3}$. To the right of the structure shown in FIG. 8, an additional layer corresponding to the layer 4 in FIG. 1a may be arranged.

As mentioned above, the LED may be made from GaAlAs, but other materials may, of course, be used, for example InGaAsP. Further, it has been described above how the layers located to the left of the PN junction 6 in the figures are P-doped and how the layers located to the right of the junction are N-doped. The doping types may, of course, be the opposite In the foregoing description, the concept "light" has been used, by which concept is meant electromagnetic radiation both within the visible wavelength band and within adjacent wavelength bands. The well located centrally in the layer 4 in FIG. 1 may be omitted and, as is shown in FIG. 8, this is also true of the layer 4 in its entirety. An LED according to the invention may, of course, contain other semiconductor layers in addition to the layers shown in the above figures.

We claim:

1. A surface emitting light emitting diode with at least one PN junction between two semiconductor layers, at least one of which is active, said diode being adapted to emit light through a predetermined exit surface wherein the diode further comprises at least one additional layer, a luminescence layer, which is made of a material with a narrower energy gap than that of the active layer and is arranged between the active layer and the exit surface.

2. A surface emitting LED according to claim 1, having a double heterostructure with a first layer of a first conduction type, a second layer of said first conduction type arranged adjacent to said first layer and between said layer and the exit surface and constituting the active layer, a third layer of a second conduction type arranged adjacent to said second layer and between said second layer and the exit surface, said first and third layers being made of a material with a wider energy gap than that of the material of the second layer, and wherein a luminescence layer with a narrower energy gap than that of the second layer is arranged between said third layer and the exit surface.

3. A surface emitting LED according to claim 1, having a single heterostructure with a first layer of a first conduction type, which constitutes the active layer, a second layer of the opposite conduction type arranged adjacent to the first layer and between said layer and the exit surface, said second layer being made of a material with a wider energy gap than that of the material in the first layer, and wherein a luminescence layer with a narrower energy gap than that of said first layer is arranged between said second layer and the exit surface.

4. A surface emitting LED according to claim 1, having a monostructure with a first layer of a first conduction type and a second layer of the opposite conduction type arranged adjacent to said first layer and between said layer and the exit surface, at least one of said layers constituting an active layer, the materials in the two layers having substantially equally large energy gaps, and wherein a luminescence layer with a narrower energy gap than that of said first and second layers is arranged between said second layer and the exit surface.

5. A surface emitting LED according to claim 1, wherein two luminescence layers are arranged on both sides of the active layer, a first luminescence layer being arranged between the active layer and the exit surface and a second luminescence layer on the opposite side of the active layer, the materials in the two luminescence layers having narrower energy gaps than that of the material in the active layer.

6. A surface emitting LED according to claim 5, wherein the materials in the two luminescence layers have energy gaps of different magnitudes.

7. A surface emitting LED according to claim 6, wherein the second luminescence layer has a narrower energy gap than the first luminescence layer.

8. A surface emitting LED according to claim 1, wherein a third luminescence layer is arranged between the first luminescence layer and the exit surface, the material in the third luminescence layer having a narrower energy gap than that of the material in the active layer.

9. A surface emitting LED according to claim 8, wherein the material in the third luminescence layer has a wider energy gap than that of the material in the first and the second luminescence layers.

10. A surface emitting LED according the claim 1, wherein a blocking layer with a material with a wider energy gap than the material in a luminescence layer is arranged adjacent to the luminescence layer and on the opposite side thereof in relation to the active layer.

11. A surface emitting LED according to claim 10, wherein a first blocking layer with a wider energy gap than that of the first luminescence layer is arranged adjacent to said first luminescence layer and between said first luminescence layer and the exit surface, and a second blocking layer with a wider energy gap than that of the second luminescence layer is arranged adjacent thereto and on the opposite side thereof in relation to the active layer.

* * * * *